US012560867B2

(12) United States Patent
Kaguchi et al.

(10) Patent No.: US 12,560,867 B2
(45) Date of Patent: Feb. 24, 2026

(54) PHOTOSENSITIVE ELEMENT AND METHOD FOR PRODUCING PHOTOSENSITIVE ELEMENT

(71) Applicant: Resonac Corporation, Tokyo (JP)

(72) Inventors: Yosuke Kaguchi, Tokyo (JP); Akiko Takeda, Tokyo (JP); Masakazu Kume, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 380 days.

(21) Appl. No.: 18/020,874

(22) PCT Filed: Jun. 15, 2021

(86) PCT No.: PCT/JP2021/022718
§ 371 (c)(1),
(2) Date: Feb. 10, 2023

(87) PCT Pub. No.: WO2022/264275
PCT Pub. Date: Dec. 22, 2022

(65) Prior Publication Data
US 2023/0393476 A1 Dec. 7, 2023

(51) Int. Cl.
*G03F 7/11* (2006.01)
(52) U.S. Cl.
CPC ..................................... *G03F 7/11* (2013.01)
(58) Field of Classification Search
CPC . G03F 7/11; G03F 7/004; B32B 27/32; B32B 2307/70; B32B 2323/04; B32B 2457/08

USPC ....................................................... 430/273.1
See application file for complete search history.

(56) References Cited

U.S. PATENT DOCUMENTS

| | | | |
|---|---|---|---|
| 2017/0153551 A1 | 6/2017 | Kume et al. | |
| 2021/0286265 A1* | 9/2021 | Kume | ................... H05K 1/036 |

FOREIGN PATENT DOCUMENTS

| | | |
|---|---|---|
| CN | 106462067 A | 2/2017 |
| JP | H6-156882 A | 6/1994 |
| JP | 2001-013681 A | 1/2001 |
| JP | 2004-191648 A | 7/2004 |
| JP | 2014-074764 A | 4/2014 |
| KR | 1020170010765 A | 2/2017 |
| WO | 2014/175274 A1 | 10/2014 |
| WO | 2015/177947 A1 | 11/2015 |
| WO | 2018/164233 A1 | 9/2018 |
| WO | 2020/012651 A1 | 1/2020 |
| WO | 2020/066351 A1 | 4/2020 |

* cited by examiner

*Primary Examiner* — Caleen O Sullivan
(74) *Attorney, Agent, or Firm* — FITCH, EVEN, TABIN & FLANNERY, LLP

(57) ABSTRACT

A photosensitive element according to the present disclosure can be produced by a method including a step of forming a photosensitive layer on a support film using a photosensitive resin composition and a step of bonding a winding outer surface of a protective film having a roll shape onto the photosensitive layer, and includes a support film, a photosensitive layer provided on one surface of the support film, and a protective film provided on a surface of the photosensitive layer opposite to the support film, and the protective film has a weld line on a surface opposite to the photosensitive layer.

7 Claims, 3 Drawing Sheets

32

PHOTOSENSITIVE ELEMENT AND METHOD FOR PRODUCING PHOTOSENSITIVE ELEMENT

CROSS-REFERENCE TO RELATED APPLICATIONS

This application is a U.S. national phase application filed under 35 U.S.C. § 371 of International Application No. PCT/JP2021/022718, filed Jun. 15, 2021, designating the United States, and is incorporated herein by reference in its entirety.

TECHNICAL FIELD

The present disclosure relates to a photosensitive element and a method for producing a photosensitive element.

BACKGROUND ART

In the field of printed circuit board production, photosensitive elements including a support film, a layer formed using a photosensitive resin composition (hereinafter, also referred to as "photosensitive layer") on the support film, and a protective film laminated on a surface of the photosensitive layer opposite to the support film have been widely used as resist materials used for an etching treatment, a plating treatment, or the like.

A printed circuit board is produced using a photosensitive element, for example, by the following procedures. That is, first, a photosensitive layer is laminated on a substrate for circuit formation such as a copper-clad laminate plate while a protective film of a photosensitive element is peeled off. Next, the photosensitive layer is exposed through a mask film or the like to form a photo-cured area. At this time, a support film is released before exposure or after exposure. Thereafter, an area other than the photo-cured area of the photosensitive layer is removed with a developing solution to form a resist pattern. Next, the substrate is subjected to an etching treatment or a plating treatment using the resist pattern as a resist to form a conductor pattern, and finally, the photo-cured area (resist pattern) of the photosensitive layer is released (removed).

From the viewpoint of reducing defects of resist patterns, it has been investigated to use a support film with a prescribed haze value, a support film with a restricted lubricant particle size, and the like as a support film (see, for example, Patent Literatures 1 and 2). Furthermore, in order to suppress the occurrence of an air bubble when a photosensitive layer is laminated on a substrate, it has been investigated to use a polypropylene film as a protective film (see, for example, Patent Literature 3).

CITATION LIST

Patent Literature

Patent Literature 1: JP 2001-13681 A
Patent Literature 2: JP 2014-74764 A
Patent Literature 3: WO 2014/175274 A1

SUMMARY OF INVENTION

Technical Problem

The photosensitive element is generally stored and used in the form of a photosensitive element roll in which an elongated photosensitive element is wound around a core. When the photosensitive element is wound, air entrapment may occur.

An object of the present disclosure is to provide a photosensitive element and a method for producing a photosensitive element which can prevent air entrapment during winding.

Solution to Problem

A photosensitive element according to the present disclosure includes a support film, a photosensitive layer provided on one surface of the support film, and a protective film provided on a surface of the photosensitive layer opposite to the support film, and the protective film has a weld line on a surface opposite to the photosensitive layer.

A method for producing a photosensitive element according to the present disclosure includes a step of forming a photosensitive layer on a support film using a photosensitive resin composition and a step of bonding a winding outer surface of a protective film having a roll shape onto the photosensitive layer, and the protective film has a weld line in a longitudinal direction of a winding inner surface.

Advantageous Effects of Invention

According to the present disclosure, it is possible to provide a photosensitive element and a method for producing a photosensitive element which can prevent air entrapment during winding.

DESCRIPTION OF EMBODIMENTS

Hereinafter, the present disclosure will be described in detail. In the present specification, the term "step" includes not only an independent step but also a step that cannot be clearly distinguished from other steps as long as an intended action of the step is achieved. The term "layer" includes a structure having a shape which is formed on a part, in addition to a structure having a shape which is formed on the whole surface, when the layer has been observed as a plan view. A numerical range that has been indicated by use of "to" indicates the range that includes the numerical values which are described before and after "to," as the minimum value and the maximum value, respectively. In the numerical ranges that are described stepwise in the present specification, the upper limit value or the lower limit value of a numerical range of a certain stage may be substituted by the upper limit value or the lower limit value of a numerical range of another stage. In a numerical range described in the present specification, the upper limit value or the lower limit value of the numerical range may be substituted by a value disclosed in the Examples.

In the present specification, the term "(meth)acrylic acid" means at least one of "acrylic acid" and "methacrylic acid" corresponding thereto, and the same applies to other analogous expressions such as (meth)acrylate.

In the present specification, the term "solid content" refers to a non-volatile content contained in a photosensitive resin composition excluding volatile substances such as water or a solvent, refers to a component remaining without volatile in drying of the resin composition, and includes a component present in a liquid, syrupy, and waxy state at room temperature near 25° C.

[Photosensitive Element]

A photosensitive element of the present embodiment includes a support film, a photosensitive layer provided on one surface of the support film, and a protective film provided on a surface of the photosensitive layer opposite to the support film, and the protective film has a weld line on a surface opposite to the photosensitive layer.

Figure 1:
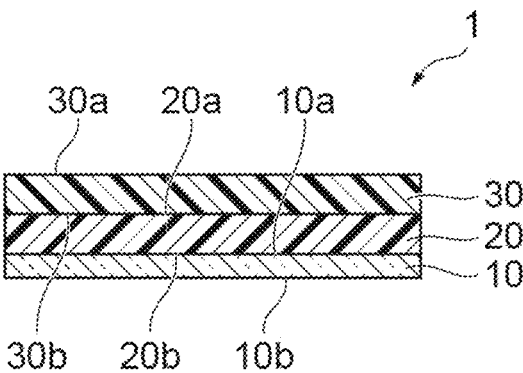
FIG. 1 is a schematic cross-sectional view illustrating a photosensitive element according to an embodiment.

FIG. 1 is a schematic cross-sectional view illustrating a photosensitive element according to an embodiment. As illustrated in FIG. 1, a photosensitive element 1 includes a support film 10, a photosensitive layer 20, and a protective film 30. The photosensitive layer 20 has one surface 20*a* and the other surface 20*b* that face each other in mutually opposite directions in a thickness direction of the photosensitive element 1. The one surface 20*a* is an opposite surface positioned on a side opposite to the support film 10. The support film 10 has one surface 10*a* and the other surface 10*b* that face each other in mutually opposite directions in the thickness direction of the photosensitive element 1. The other surface 20*b* is a facing surface facing the one surface 10*a*. The photosensitive layer 20 is provided on the one surface 10*a* of the support film in a state where the other surface 20*b* faces the one surface 10*a*.

(Protective Film)

The protective film 30 has one surface 30*a* and the other surface 30*b* that face each other in mutually opposite directions in the thickness direction of the photosensitive element 1. The one surface 30*a* is positioned on a side opposite to the support film 10. The other surface 30*b* faces the one surface 20*a*. The protective film 30 is provided on the one surface 20*a* of the photosensitive layer in a state where the other surface 30*b* faces the one surface 20*a*.

The one surface 30*a* is a winding inner surface of a protective film having a roll shape and has a weld line in a longitudinal direction. The weld line is a streak-shaped raised portion also called a weld mark. The weld line is a visual phenomenon that the weld line is visible as a white streak in a feeding direction of the film, and is generated in the longitudinal direction of the winding inner surface of the film. When a resin melted inside a die is extruded from a plurality of discharge ports to produce a film, the weld line is considered to be generated due to a temperature difference when the extruded resins merge together.

Figure 2:
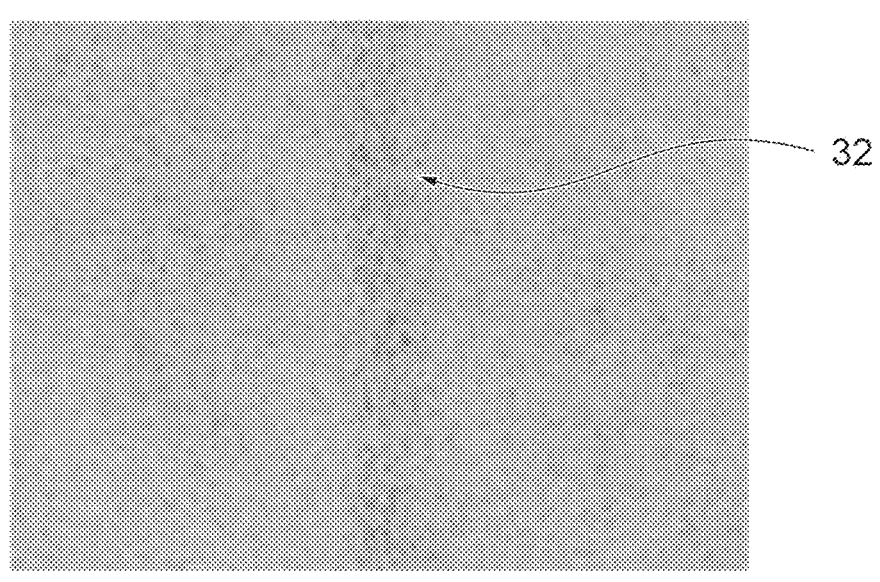
FIG. 2 is a photograph showing an example of an appearance of a winding inner surface of a protective film.

FIG. 2 is a photograph showing an example of an appearance of a winding inner surface of a protective film. As shown in FIG. 2, the protective film according to the present embodiment has a weld line 32 in the longitudinal direction of the winding inner surface. When the photosensitive element 1 is wound around the core, the one surface 30*a* of the protective film is positioned on the inner side of the photosensitive element so that air entrapment can be prevented. Furthermore, since the one surface 30*a* is not in contact with the photosensitive layer, the shape of the weld line 32 can be prevented from being transferred to the surface of the photosensitive layer when the photosensitive element is produced. As such, the appearance of the photosensitive layer can be improved, and defects of resist patterns to be formed can be suppressed.

The width of the weld line may be 45 μm or more, 50 μm or more, 55 μm or more, or 60 μm or more, and may be 300

μm or less, 200 μm or less, 150 μm or less, or 100 μm or less, from the viewpoint of further preventing air entrapment. The width of the weld line may be 45 to 300 μm, 50 to 200 μm, 55 to 150 μm, or 60 to 100 μm.

The height of the weld line may be 0.10 μm or more, 0.12 μm or more, 0.14 μm or more, or 0.16 μm or more, and may be 3.0 μm or less, 2.8 μm or less, 2.5 μm or less, or 2.2 μm or less, from the viewpoint of further preventing air entrapment. The height of the weld line may be 0.10 to 3.0 μm, 0.12 to 2.8 μm, 0.14 to 2.5 μm, or 0.16 to 2.2 μm.

The thickness of the protective film 30 may be 5 to 70 μm, 10 to 60 μm, 10 to 50 μm, 15 to 40 μm, or 15 to 30 μm.

As the protective film 30, it is preferable to use a film so that the adhesive force between the photosensitive layer 20 and the support film 10 is smaller than the adhesive force between the photosensitive layer 20 and the protective film 30. Examples of the protective film include polyolefin films such as polyethylene and polypropylene. A polyethylene film is preferably used as a protective film from the viewpoint that winding misalignment of the photosensitive element is less likely to occur, the viewpoint that static electricity is less likely to be generated when the protective film is peeled off from the photosensitive layer, and the viewpoint that breakage of the photosensitive layer is less likely to occur.

(Support Film)

The support film 10 has the one surface 10*a* and the other surface 10*b* that face each other in mutually opposite directions in the thickness direction of the photosensitive element 1. The photosensitive layer 20 is provided on the one surface 10*a* of the support film 10. Examples of the support film include polyester films such as polyethylene terephthalate (PET), polybutylene telephthalate (PBT), and polyethylene-2,6-naphthalate (PEN).

The haze of the support film may be 0.01 to 5.0%, 0.01 to 1.5%, 0.01 to 1.0%, or 0.01 to 0.5%. The haze refers to a value measured using a commercially available cloudiness meter (turbidimeter) according to the method defined in JIS K7105. The haze can be measured, for example, using a commercially available turbidimeter such as NDH-5000 (manufactured by NIPPON DENSHOKU INDUSTRIES CO., LTD., trade name).

The thickness of the support film may be 5 to 100 μm, 5 to 70 μm, 8 to 50 μm, 10 to 30 μm, or 12 to 25 μm.

(Photosensitive Layer)

The photosensitive layer 20 is a layer formed from a photosensitive resin composition. The thickness of the photosensitive layer 20 may be 1 to 200 μm, 5 to 100 μm, 8 to 50 μm, or 10 to 30 μm.

The photosensitive resin composition used for forming the photosensitive layer 20 is not particularly limited. The photosensitive resin composition may contain a binder polymer (A), a photopolymerizable compound (B), and a photopolymerization initiator (C).

The binder polymer (A) (hereinafter, also referred to as "component (A)") can be produced, for example, by radical polymerization of a polymerizable monomer. Examples of the polymerizable monomer include styrene or a styrene derivative, acrylamides such as diacetone acrylamide, acrylonitriles, vinyl alcohol ethers such as vinyl-n-butyl ether, alkyl (meth)acrylate ester, benzyl (meth)acrylate ester, tetrahydrofurfuryl (meth)acrylate ester, dimethylaminoethyl (meth)acrylate ester, di ethyl amino ethyl (meth)acrylate ester, glycidyl (meth)acrylate ester, 2,2,2-trifluoroethyl (meth)acrylate, 2,2,3,3-tetrafluoropropyl (meth)acrylate, (meth)acrylic acid, α-bromoacrylic acid, α-chloracrylic acid, β-furyl(meth)acrylic acid, β-styryl(meth)acrylic acid, maleic acid, maleic anhydride, maleic acid monoesters such as monomethyl malate, monoethyl malate, and monoisopropyl malate, fumaric acid, cinnamic acid, $\alpha$-cyanocinnamic acid, itaconic acid, crotonic acid, and propiolic acid. The polymerizable monomer can be used singly or in combination of two or more kinds thereof.

The component (A) may have a carboxy group from the viewpoint of alkali developability. The component (A) having a carboxy group can be produced, for example, by radical polymerization of a polymerizable monomer having a carboxy group with another polymerizable monomer. The polymerizable monomer having a carboxy group may be (meth)acrylic acid, and may be methacrylic acid.

From the viewpoint of improving alkali developability and alkali resistance in a well-balanced manner, the content of the structural unit based on the polymerizable monomer having a carboxy group may be 10 to 50% by mass, 15 to 40% by mass, or 20 to 35% by mass, on the basis of the total amount of the component (A). When the content of the carboxy group is 10% by mass or more, there is a tendency that the alkali developability is improved, and when the content of the carboxy group is 50% by mass or less, there is a tendency that the alkali resistance is excellent.

The acid value of the component (A) having a carboxy group may be 50 to 250 mgKOH/g, 50 to 200 mgKOH/g, or 100 to 200 mgKOH/g.

From the viewpoint of adhesiveness and release property, the component (A) may have a structural unit based on styrene or a styrene derivative. The styrene derivative is a polymerizable compound in which the hydrogen atom at the $\alpha$-position or of the aromatic ring of styrene such as vinyl toluene or $\alpha$-methylstyrene has been substituted. The content of the structural unit based on the styrene or the styrene derivative in the component (A) may be 10 to 60% by mass, 15 to 50% by mass, 35 to 50% by mass, or 40 to 50% by mass. When the content thereof is 10% by mass or more, there is a tendency that adhesiveness is improved, and when the content thereof is 60% by mass or less, there are tendencies that an increase in size of the released pieces can be suppressed during the development, and thus an increase in time required for releasing can be suppressed.

The component (A) may have a structural unit based on benzyl (meth)acrylate ester from the viewpoint of improving resolution. The content of the structural unit derived from the benzyl (meth)acrylate ester in the component (A) may be 10 to 40% by mass, 15 to 35% by mass, or 20 to 30% by mass.

The component (A) may have a structural unit based on alkyl (meth)acrylate ester from the viewpoint of improving plasticity. Examples of the alkyl (meth)acrylate ester include methyl (meth)acrylate ester, ethyl (meth)acrylate ester, propyl (meth)acrylate ester, butyl (meth)acrylate ester, pentyl (meth)acrylate ester, hexyl (meth)acrylate ester, heptyl (meth)acrylate ester, octyl (meth)acrylate ester, 2-ethylhexyl (meth)acrylate ester, nonyl (meth)acrylate ester, decyl (meth)acrylate ester, undecyl (meth)acrylate ester, and dodecyl (meth)acrylate ester.

The weight average molecular weight (Mw) of the component (A) may be 10000 to 300000, 15000 to 150000, 20000 to 100000, or 25000 to 80000. When the Mw of the component (A) is 10000 or more, there is a tendency that developing solution resistance is excellent, and when the Mw of the component (A) is 300000 or less, there is a tendency that an increase in developing time is suppressed. The degree of dispersion (weight average molecular weight/number average molecular weight) of the component (A)

may be 1.0 to 3.0, 1.0 to 2.5, or 1.0 to 2.0. When the degree of dispersion is decreased, there is a tendency that resolution is improved.

The weight average molecular weight and the number average molecular weight in the present specification are values measured by gel permeation chromatography (GPC) and converted with standard polystyrenes as standard samples.

The component (A) can be used singly or in combination of two or more kinds thereof. Examples of the component (A) in the case of being used in combination of two or more kinds thereof include two or more kinds of binder polymers each including a different polymerizable monomer, two or more kinds of binder polymers each having a different Mw, and two or more kinds of binder polymers each having a different degree of dispersion.

The content of the component (A) may be 30 to 80 parts by mass, to 75 parts by mass, 50 to 70 parts by mass, or 50 to 60 parts by mass, with respect to 100 parts by mass of the total amount of the component (A) and a component (B) described below. When the content of the component (A) is within this range, the strength of the photo-cured area of the photosensitive layer becomes more favorable.

As the photopolymerizable compound (B) (hereinafter, also referred to as "component (B)"), a compound having at least one ethylenically unsaturated bond in the molecule can be used. The component (B) can be used singly or in combination of two or more kinds thereof.

The ethylenically unsaturated bond of the component (B) is not particularly limited as long as photopolymerization is possible. Examples of the ethylenically unsaturated bond include $\alpha,\beta$-unsaturated carbonyl groups such as a (meth)acryloyl group. Examples of the photopolymerizable compound having an $\alpha,\beta$-unsaturated carbonyl group include $\alpha,\beta$-unsaturated carboxylic acid esters of polyhydric alcohols, bisphenol-type (meth)acrylates, $\alpha,\beta$-unsaturated carboxylic acid adducts of glycidyl group-containing compounds, (meth)acrylates having a urethane bond, nonylphenoxypolyethylene oxyacrylate, (meth)acrylates having a phthalic acid skeleton, and alkyl (meth)acrylate esters.

Examples of the $\alpha,\beta$-unsaturated carboxylic acid esters of polyhydric alcohols include polyethylene glycol di(meth)acrylate in which the number of ethylene groups is 2 to 14, polypropylene glycol di(meth)acrylate in which the number of propylene groups is 2 to 14, polyethylene-polypropylene glycol di(meth)acrylate in which the number of ethylene groups is 2 to 14 and the number of propylene groups is 2 to 14, trimethylol propane di(meth)acrylate, trimethylolpropane tri(meth)acrylate, EO-modified trimethylolpropane tri(meth)acrylate, PO-modified trimethylolpropane tri(meth)acrylate, EO, PO-modified trimethylolpropane tri(meth)acrylate, tetramethylolmethane tri(meth)acrylate, tetramethylolmethane tetra(meth)acrylate, and a (meth)acrylate compound having a skeleton derived from dipentaerythritol or pentaerythritol. The term "EO-modified" means having a block structure of an ethylene oxide (EO) group, and the term "PO-modified" means having a block structure of a propylene oxide (PO) group.

From the viewpoint of improving the flexibility of the resist pattern, the component (B) may contain polyalkylene glycol di(meth)acrylate. The polyalkylene glycol di(meth)acrylate may have at least one of the EO group and the PO group, and may have both the EO group and the PO group. In the polyalkylene glycol di(meth)acrylate having both the EO group and the PO group, the EO group and the PO group may be present as continuous blocks or present randomly.

Furthermore, the PO group may be either an oxy-n-propylene group or an oxyisopropylene group. Note that, in a (poly)oxyisopropylene group, the secondary carbon of the propylene group may be bonded to an oxygen atom, and the primary carbon may be bonded to an oxygen atom.

Examples of commercially available products of polyalkylene glycol di(meth)acrylate include FA-023M (manufactured by Showa Denko Materials Co., Ltd.), FA-024M (manufactured by Showa Denko Materials Co., Ltd.), and NK ESTETR HEMA-9P (manufactured by SHIN-NAKA-MURA CHEMICAL Co., Ltd.).

From the viewpoint of improving the flexibility of the resist pattern, the component (B) may contain a (meth)acrylate having a urethane bond. Examples of the (meth)acrylate having a urethane bond include addition reaction products of (meth)acrylic monomers with an OH group at the β-position and diisocyanate (such as isophorone diisocyanate, 2,6-toluene diisocyanate, 2,4-toluene diisocyanate, or 1,6-hexamethylene diisocyanate), tris((meth)acryloxytetraethylene glycol isocyanate) hexamethylene isocyanurate, EO-modified urethane di(meth)acrylate, and EO, PO-modified urethane di(meth)acrylate.

Examples of commercially available products of the EO-modified urethane di(meth)acrylate include "UA-11" and "UA-21EB" (manufactured by SHIN-NAKAMURA CHEMICAL Co., Ltd.). Examples of commercially available products of the EO, PO-modified urethane di(meth) acrylate include "UA-13" (manufactured by SHIN-NAKA-MURA CHEMICAL Co., Ltd.).

From the viewpoint of easily forming a thick resist pattern and improving resolution and adhesiveness in a well-balanced manner, the component (B) may contain a (meth)acrylate compound having a skeleton derived from dipentaerythritol or pentaerythritol. The (meth)acrylate compound having a skeleton derived from dipentaerythritol or pentaerythritol preferably has four or more (meth)acryloyl groups and may be dipentaerythritol penta(meth)acrylate or dipentaerythritol hexa(meth)acrylate.

As the component (B), a polyfunctional (meth)acrylate compound obtained by reacting an α,β-unsaturated carboxylic acid with a polyhydric alcohol may be contained. The polyfunctional (meth)acrylate compound may have at least one of the EO group and the PO group, and may have both the EO group and the PO group. As such a compound, dipentaerythritol (meth)acrylate having an EO group, and the like can be used. Examples of commercially available products of the dipentaerythritol (meth)acrylate having an EO group include DPEA-12 (manufactured by Nippon Kayaku Co., Ltd.).

From the viewpoint of improving resolution and release property after curing, the component (B) may contain bisphenol-type (meth)acrylates, and may contain a bisphenol A-type (meth)acrylate among the bisphenol-type (meth) acrylates. Examples of the bisphenol A-type (meth)acrylate include 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane, and 2,2-bis(4-((meth)acryloxypolyethoxy-polypropoxy)phenyl)propane.

Examples of commercially available products of 2,2-bis (4-((meth)acryloxydiethoxy)phenyl)propane include BPE-200 (manufactured by SHIN-NAKAMURA CHEMICAL Co., Ltd.), and examples of commercially available products of 2,2-bis(4-(methacryloxypentaethoxy)phenyl)propane include BPE-500 (manufactured by SHIN-NAKAMURA CHEMICAL Co., Ltd.) and FA-321M (manufactured by Showa Denko Materials Co., Ltd.).

Examples of the nonylphenoxypolyethylene oxyacrylate include nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate, and nonylphenoxyundecaethylene oxyacrylate.

Examples of the (meth)acrylates having a phthalic acid skeleton include γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate. The γ-chloro-β-hydroxypropyl-β'-methacryloyloxyethyl-o-phthalate is commercially available as FA-MECH (manufactured by Showa Denko Materials Co., Ltd.).

The photopolymerization initiator (C) (hereinafter, also referred to as "component (C)") is not particularly limited as long as it can polymerize the component (B), and can be appropriately selected from photopolymerization initiators generally used. The component (C) can be used singly or in combination of two or more kinds thereof.

Examples of the component (C) include acylphosphine oxide-based, oxime ester-based, aromatic ketone-based, quinone-based, alkylphenon-based, imidazole-based, acridine-based, phenylglycine-based, and coumarin-based photopolymerization initiators. From the viewpoint of improving sensitivity and resolution in a well-balanced manner, the component (C) may contain an acridine-based photopolymerization initiator, a phenylglycine-based photopolymerization initiator, or an imidazole-based photopolymerization initiator.

Examples of the acridine-based photopolymerization initiator include 9-phenylacridine, 9-(p-methylphenyl)acridine, 9-(m-methylphenypacridine, 9-(p-chlorophenyl)acridine, 9-(m-chlorophenyl)acridine, 9-aminoacridine, 9-dimethylaminoaridine, 9-diethylaminoacridine, 9-pentylaminoacridine, bis(9-acridinyl)alkanes such as 1,2-bis(9-acridinyl) ethane, 1,4-bis(9-acridinyl)butane, 1,6-bis(9-acridinyl) hexane, 1,8-bis(9-acridinyl)octane, 1,10-bis(9-acridinyl) decane, 1,12-bis(9-acridinyl)dodecane, 1,14-bis(9-acridinyl)tetradecane, 1,16-bis(9-acridinyl)hexadecane, 1,18-bis(9-acridinyl)octadecane, and 1,20-bis(9-acridinyl) eicosane, 1,3-bis(9-acridinyl)-2-oxapropane, 1,3-bis(9-acridinyl)-2-thiapropane, and 1,5-bis(9-acridinyl)-3-thiapentane.

Examples of the phenylglycine-based photopolymerization initiator include N-phenylglycine, N-methyl-N-phenylglycine, and N-ethyl-N-phenylglycine.

Examples of a hexaarylbiimidazole-based photopolymerization initiator include 2-(o-chlorophenyl)-4,5-diphenyl-biimidazole, 2,2',5-tris-(o-chlorophenyl)-4-(3,4-dimethoxy-phenyl)-4',5'-diphenylbiimidazole, 2,4-bis-(o-chlorophenyl)-5-(3,4-dimethoxyphenyl)-diphenylbiimidazole, 2,4, 5-tris-(o-chlorophenyl)-diphenylbiimidazole, 2-(o-chlorophenyl)-bis-4,5-(3,4-dimethoxyphenyl)-biimidazole, 2,2'-bis-(2-fluorophenyl)-4,4',5,5'-tetrakis-(3-methoxyphenyl)-biimidazole, 2,2'-bis-(2,3-difluoromethylphenyl)-4,4',5,5'-tetrakis-(3-methoxyphenyl)-biimidazole, 2,2'-bis-(2,4-difluorophenyl)-4,4',5,5'-tetrakis-(3-methoxyphenyl)-biimidazole, and 2,2'-bis-(2,5-difluorophenyl)-4,4',5,5'-tetrakis-(3-methoxyphenyl)-biimidazole.

The content of the component (C) may be 0.1 to 10 parts by mass, 1 to 5 parts by mass, or 2 to 4.5 parts by mass, with respect to 100 parts by mass of the total amount of the component (A) and the component (B). When the content of the component (C) is 0.1 parts by mass or more, there is a tendency that photosensitivity, resolution, and adhesiveness are improved, and when the content of the component (C) is 10 parts by mass or less, there is a tendency that the resist pattern formability is more excellent.

The photosensitive resin composition according to the present embodiment may further contain a photosensitizer (D) (hereinafter, also referred to as "component (D)"). By containing the component (D), the absorption wavelength of active light rays used for exposure can be effectively utilized. The component (D) can be used singly or in combination of two or more kinds thereof.

Examples of the component (D) include a dialkylamino-benzophenone compound, a pyrazoline compound, an anthracene compound, a coumarin compound, a xanthone compound, a thioxanthone compound, an oxazole compound, a benzooxazole compound, a thiazole compound, a benzothiazole compound, a triazole compound, a stilbene compound, a triazine compound, a thiophene compound, a naphthalimide compound, a triarylamine compound, and an aminoacridine compound. From the viewpoint of further improving resolution, the component (D) may contain a pyrazoline compound or an anthracene compound.

Examples of the pyrazoline compound include 1-(4-methoxyphenyl)-3-styryl-5-phenyl-pyrazoline, 1-phenyl-3-(4-methoxystyryl)-5-(4-methoxyphenyl)-pyrazoline, 1,5-bis-(4-methoxyphenyl)-3-(4-methoxystyryl)-pyrazoline, 1-(4-isopropylphenyl)-3-styryl-5-phenyl-pyrazoline, 1-phenyl-3-(4-isopropylstyryl)-5-(4-isopropylphenyl)-pyrazoline, 1,5-bis-(4-isopropylphenyl)-3-(4-isopropylstyryl)-pyrazoline, 1-(4-methoxyphenyl)-3-(4-tert-butyl-styryl)-5-(4-tert-butyl-phenyl)-pyrazoline, 1-(4-tert-butyl-phenyl)-3-(4-methoxystyryl)-5-(4-methoxyphenyl)-pyrazoline, 1-(4-isopropyl-phenyl)-3-(4-tert-butyl-styryl)-5-(4-tert-butyl-phenyl)-pyrazoline, 1-(4-tert-butyl-phenyl)-3-(4-isopropyl-styryl)-5-(4-isopropyl-phenyl)-pyrazoline, 1-(4-methoxyphenyl)-3-(4-isopropylstyryl)-5-(4-isopropylphenyl)-pyrazoline, 1-(4-isopropyl-phenyl)-3-(4-methoxystyryl)-5-(4-methoxyphenyl)-pyrazoline, 1-phenyl-3-(3,5-dimethoxystyryl)-5-(3,5-dimethoxyphenyl)-pyrazoline, 1-phenyl-3-(3,4-dimethoxystyryl)-5-(3,4-dimethoxyphenyl)-pyrazoline, 1-phenyl-3-(2,6-dimethoxystyryl)-5-(2,6-dimethoxyphenyl)-pyrazoline, 1-phenyl-3-(2,5-dimethoxystyryl)-5-(2,5-dimethoxyphenyl)-pyrazoline, 1-phenyl-3-(2,3-dimethoxystyryl)-5-(2,3-dimethoxyphenyl)-pyrazoline, 1-phenyl-3-(2,4-dimethoxystyryl)-5-(2,4-dimethoxyphenyl)-pyrazoline, 1-(4-methoxyphenyl)-3-(3,5-dimethoxystyryl)-5-(3,5-dimethoxyphenyl)-pyrazoline, 1-(4-methoxyphenyl)-3-(3,4-dimethoxystyryl)-5-(3,4-dimethoxyphenyl)-pyrazoline, 1-(4-methoxyphenyl)-3-(2,6-dimethoxystyryl)-5-(2,6-dimethoxyphenyl)-pyrazoline, 1-(4-methoxyphenyl)-3-(2,5-dimethoxystyryl)-5-(2,5-dimethoxyphenyl)-pyrazoline, 1-(4-methoxyphenyl)-3-(2,3-dimethoxystyryl)-5-(2,3-dimethoxyphenyl)-pyrazoline, 1-(4-methoxyphenyl)-3-(2,4-dimethoxystyryl)-5-(2,4-dimethoxyphenyl)-pyrazoline, 1-(4-tert-butyl-phenyl)-3-(3,5-dimethoxystyryl)-5-(3,5-dimethoxyphenyl)-pyrazoline, 1-(4-tert-butyl-phenyl)-3-(3,4-dimethoxystyryl)-5-(3,4-dimethoxyphenyl)-pyrazoline, 1-(4-tert-butyl-phenyl)-3-(2,6-dimethoxystyryl)-5-(2,6-dimethoxyphenyl)-pyrazoline, 1-(4-tert-butyl-phenyl)-3-(2,5-dimethoxystyryl)-5-(2,5-dimethoxyphenyl)-pyrazoline, 1-(4-tert-butyl-phenyl)-3-(2,3-dimethoxystyryl)-5-(2,3-dimethoxyphenyl)-pyrazoline, 1-(4-tert-butyl-phenyl)-3-(2,4-dimethoxystyryl)-5-(2,4-dimethoxyphenyl)-pyrazoline, 1-(4-isopropyl-phenyl)-3-(3,5-dimethoxystyryl)-5-(3,5-dimethoxyphenyl)-pyrazoline, 1-(4-isopropyl-phenyl)-3-(3,4-dimethoxystyryl)-5-(3,4-dimethoxyphenyl)-pyrazoline, 1-(4-isopropyl-phenyl)-3-(2,6-dimethoxystyryl)-5-(2,6-dimethoxyphenyl)-pyrazoline, 1-(4-isopropyl-phenyl)-3-(2,5-dimethoxystyryl)-5-(2,5-dimethoxyphenyl)-pyrazoline, 1-(4-isopropyl-phenyl)-3-(2,3-dimethoxystyryl)-5-(2,3-dimethoxyphenyl)-pyrazoline, and 1-(4-isopropyl-phenyl)-3-(2,4-dimethoxystyryl)-5-(2,4-dimethoxyphenyl)-pyrazoline.

Examples of the anthracene compound include 9,10-dimethoxyanthracene, 9,10-diethoxyanthracene, 9,10-dipropoxyanthracene, 9,10-dibutoxyanthracene, and 9,10-dipentoxyanthracene.

From the viewpoint of improving photosensitivity and resolution, the content of the component (D) may be 0.01 to 5 parts by mass, 0.01 to 1 part by mass, or 0.01 to 0.2 parts by mass, with respect to 100 parts by mass of the total amount of the component (A) and the component (B).

The photosensitive resin composition according to the present embodiment may further contain, as necessary, additives such as a dye, a photochromic agent, a thermal development inhibitor, a plasticizer, a pigment, a filler, an antifoaming agent, a flame retardant, a tackifier, a leveling agent, a release promoter, an antioxidant, an aroma, an imaging agent, a thermal crosslinking agent, and a polymerization inhibitor. These additives can be used singly or in combination of two or more kinds thereof.

Examples of the dye include Malachite Green, Victoria Pure Blue, Brilliant Green, and Methyl Violet. Examples of the photochromic agent include tribromophenylsulfone, leuco crystal violet, diphenylamine, benzylamine, triphenylamine, diethylaniline, and o-chloroaniline. Examples of the plasticizer include p-toluenesulfonamide.

The photosensitive resin composition can be prepared as a solution having a solid content of about 30 to 60% by mass, as necessary, by dissolving the photosensitive resin composition in a solvent such as methanol, ethanol, acetone, methyl ethyl ketone, methyl cellosolve, ethyl cellosolve, toluene, N,N-dimethylformamide, or propylene glycol monomethyl ether, or a mixed solvent of such solvents.

(Intermediate Layer)

The photosensitive element of the present embodiment may include an intermediate layer (not illustrated) between the support film 10 and the photosensitive layer 20. The adhesive force between the support film and the intermediate layer may be smaller than the adhesive force between the intermediate layer and the photosensitive layer. The intermediate layer may have water solubility, and may have dissolubility with respect to a developing solution. The intermediate layer is a layer formed using a resin composition for forming an intermediate layer described below.

The resin composition for forming an intermediate layer may contain a water-soluble resin. By containing a water-soluble resin, there is a tendency that the dissolubility of an intermediate layer to be formed is improved. Furthermore, since it becomes easy to maintain the layer isolation between the intermediate layer to be formed and the photosensitive layer for a long period of time, there is a tendency that stability is improved. Examples of the water-soluble resin include polyvinyl alcohol and polyvinylpyrrolidone. From the viewpoint that an oxygen transmission coefficient is low and deactivation of radicals occurring due to active light rays used for exposure can be further suppressed, the resin composition for forming an intermediate layer may contain polyvinyl alcohol. The polyvinyl alcohol can be obtained, for example, by saponification of polyvinyl acetate obtained by polymerization of vinyl acetate. The saponification degree of polyvinyl alcohol used in the present embodiment may be 50 mol % or more, 70 mol % or more, or 80 mol % or more. By using polyvinyl alcohol having a saponification degree of 50 mol % or more, there are tendencies that the gas barrier property of the intermediate layer can be further improved, and the resolution of a resist pattern to be formed can be further improved. Note that, the "saponification degree" in the present specification refers to a value measured according to JIS K 6726 (1994) (Testing methods for polyvinyl alcohol) defined in Japanese Industrial Standards. Furthermore, the upper limit value of such a saponification degree may be 100 mol %.

The average polymerization degree of polyvinyl alcohol may be 300 to 3500, 300 to 2500, or 300 to 1000. Furthermore, the average polymerization degree of polyvinylpyrrolidone may be 10000 to 100000 or 10000 to 50000. As for the above-described polyvinyl alcohol, two or more kinds of polyvinyl alcohols having different saponification degrees, different viscosities, different polymerization degrees, different modifying groups, and the like may be used in combination.

The resin composition for forming an intermediate layer may contain a resin having dissolubility with respect to a developing solution. As the resin having dissolubility with respect to a developing solution, for example, the component (A) used in the photosensitive resin composition may be contained, and the component (B) may be contained. By containing the resin having dissolubility with respect to a developing solution, there are tendencies that the adhesiveness between the intermediate layer to be formed and the photosensitive layer is improved and the photosensitive layer is easily formed on the intermediate layer to be formed.

In order to improve the handleability of the resin composition or adjust the viscosity and storage stability, the resin composition for forming an intermediate layer can contain at least one kind of solvents as necessary. Examples of the solvent include water and an organic solvent. Examples of the organic solvent include methanol, acetone, toluene, and a mixed solvent of these. From the viewpoint of improving drying efficiency at the time of forming the intermediate layer, methanol may be contained. Furthermore, in a case where the resin composition for forming an intermediate layer contains a water-soluble resin, water, and methanol, the content of the methanol may be 1 to 100 parts by mass, 10 to 80 parts by mass, or 20 to 60 parts by mass, with respect to 100 parts by mass of water, from the viewpoint of dissolubility with respect to the water-soluble resin. The content of the water-soluble resin may be 1 to 50 parts by mass or 10 to 30 parts by mass, with respect to 100 parts by mass of water.

The resin composition for forming an intermediate layer may be blended with known additives such as a surfactant, a plasticizer, and a leveling agent. Examples of the leveling agent include a silicone-based leveling agent. Examples of commercially available products of the silicone-based leveling agent include POLYFLOW KL-401 (manufactured by Kyoeisha Chemical Co., Ltd.). In the case of containing a leveling agent, the content of the leveling agent may be 0.01 to 2.0 parts by mass or 0.05 to 1.0 part by mass, with respect to 100 parts by mass of the resin composition for forming an intermediate layer, from the viewpoint of ease of formation of an intermediate layer.

From the viewpoint of improving releasability with the support film, a silicone-based surfactant or a fluorine-based surfactant can be contained as the surfactant. These surfactants can be used singly or in combination of two or more kinds thereof. In the case of containing a surfactant, the content of the surfactant may be 0.01 to 1.0 part by mass, 0.05 to 0.5 parts by mass, or 0.1 to 0.3 parts by mass, with respect to 100 parts by mass of the resin composition for forming an intermediate layer, from the viewpoint of ease of formation of an intermediate layer.

For example, from the viewpoint of improving ease of formation of an intermediate layer, a polyhydric alcohol compound can be contained as the plasticizer. Examples of the plasticizer include glycerins such as glycerin, diglycerin, and triglycerin; (poly)alkylene glycols such as ethylene glycol, diethylene glycol, triethylene glycol, tetraethylene glycol, polyethylene glycol, propylene glycol, dipropylene glycol, and polypropylene glycol; and trimethylol propane. These plasticizers can be used singly or in combination of two or more kinds thereof.

The thickness of the intermediate layer is not particularly limited, and may be 12 μm or less, 10 μm or less, or 8 μm or less, from the viewpoint of developability. Furthermore, the thickness of the intermediate layer may be 1.0 μm or more, 1.5 μm or more, or 2 μm or more, from the viewpoint of ease of formation of the intermediate layer and resolution.

[Method for Producing Photosensitive Element]

A method for producing a photosensitive element according to the present embodiment includes a step of forming a photosensitive layer on a support film using a photosensitive resin composition and a step of bonding a winding outer surface of a protective film having a roll shape onto the photosensitive layer.

The photosensitive layer 20 of the photosensitive element 1 can be formed by applying a photosensitive resin composition onto the one surface 10a of the support film and drying the photosensitive resin composition. The applying of the photosensitive resin composition can be performed, for example, using known methods such as roll coating, comma coating, gravure coating, air knife coating, die coating, and bar coating. The drying of the photosensitive resin composition can be performed, for example, at 70 to 150° C. for about 5 to 30 minutes.

Since the protective film 30 has a weld line in the longitudinal direction of the winding inner surface, the other surface 30b that is the winding outer surface of the protective film having a roll shape is bonded onto the one surface 20a of the photosensitive layer. When the protective film 30 is bonded to the photosensitive layer 20, for example, a turret-type winding/unwinding device can be used. At this time, by using a device capable of reversibly rotating a turret, productivity of the photosensitive element can be improved.

[Photosensitive Element Roll]

Figure 3:
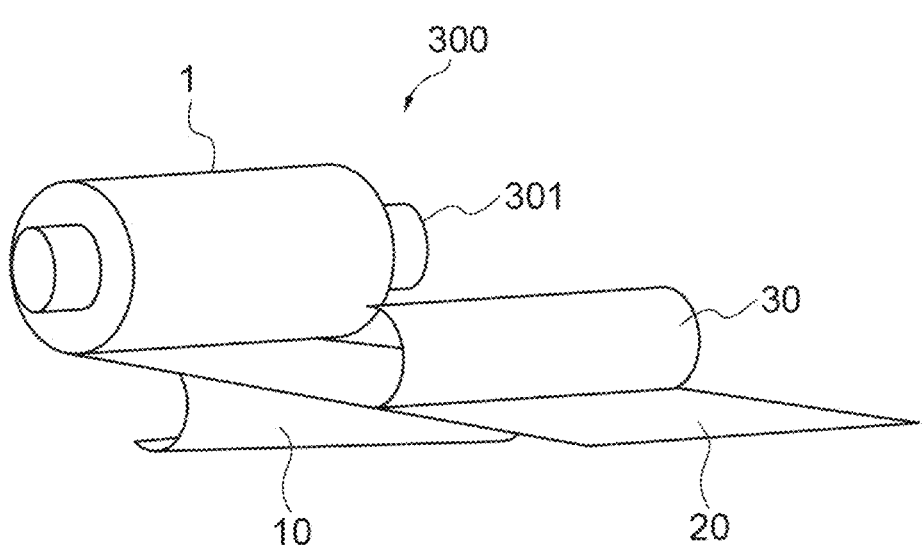
FIG. 3 is a perspective view illustrating a photosensitive element roll according to an embodiment.

FIG. 3 is a perspective view illustrating a photosensitive element roll according to an embodiment. A photosensitive element roll 300 illustrated in FIG. 3 includes a core 301 and a wound body of the photosensitive element 1 wound around the core 301. The photosensitive element 1 may be stored (reserved) in any forms, but can be stored in the form of the photosensitive element roll 300 in which the photosensitive element 1 is wound in a roll shape.

The core 301 has, for example, a cylindrical shape. The material for the core 301 is not particularly limited as long as it is conventionally used, and examples thereof include plastics such as a polyethylene resin, a polypropylene resin, a polystyrene resin, a polyvinyl chloride resin, and an ABS resin (an acrylonitrile-butadiene-styrene copolymer). The photosensitive element 1 is preferably wound so that the support film 10 is outermost.

[Method for Forming Resist Pattern]

A method for forming a resist pattern according to the present embodiment includes a lamination step of laminating the photosensitive layer 20 of the photosensitive element 1 on a substrate in order of the photosensitive layer and the support film, an exposure step of irradiating a predetermined part of the photosensitive layer 20 with an active light ray through the support film 10 to form a photo-cured area, and a development step of removing an area other than the photo-cured area in the photosensitive layer 20.

In the lamination step, for example, the protective film is removed from the photosensitive element and the photosensitive layer and the support film of the photosensitive element are laminated on the substrate in this order. In the lamination step, as a method of laminating the photosensitive layer 20 on the substrate, for example, a method of laminating the photosensitive layer on the substrate by pressure-bonding the substrate at a pressure of about 0.1 to 1 MPa while heating the photosensitive layer 20 to about 70 to 130° C. after removing the protective film is exemplified. In the lamination step, lamination can also be performed under reduced pressure. Note that, a surface of the substrate on which the photosensitive layer 20 is laminated is usually a metal surface, but is not particularly limited. Furthermore, in order to further improving laminating properties, the substrate may be subjected to a preheating treatment.

In the exposure step, the support film is removed or a predetermined part of the photosensitive layer 20 is irradiated with an active light ray through the support film 10 to form a photo-cured area on the photosensitive layer 20. Examples of the exposure method include a method of emitting active light rays imagewise through a negative or positive mask pattern, referred to as artwork (mask exposure method), a method of emitting active light rays imagewise by a projection exposure method, and a method of emitting active light rays imagewise by a direct writing exposure method such as an LDI (Laser Direct Imaging) exposure method or a DLP (Digital Light Processing) exposure method.

Known light sources can be used as a light source for the active light ray, and for example, a carbon arc lamp, a mercury vapor arc lamp, a high-pressure mercury lamp, a xenon lamp, a gas laser such as an argon laser, a solid-state laser such as a YAG laser, and a semiconductor laser, which efficiently emit ultraviolet rays or visible light, are used.

From the viewpoint of improving adhesiveness, post exposure bake (PEB) may be performed after the exposure and before the development. The temperature in the case of performing PEB may be 50 to 100° C. As a heating machine, a hot plate, a box-type dryer, a heating roll, and the like may be used.

In the development step, at least a part of the photosensitive layer other than the photo-cured area is removed from the substrate, so that a resist pattern is formed on the substrate.

In the development step, after the support film 10 is released and removed from the photosensitive layer 20, an area other than the photo-cured area in the photosensitive layer is removed. In the development step, a resist pattern can be produced, for example, by removing and developing an unexposed area (non-photo-cured area) of the photosensitive layer 20 with wet development using a developing solution such as an alkaline aqueous solution, an aqueous developing solution, or an organic solvent, dry development, or the like.

Examples of the alkaline aqueous solution include a 0.1 to 5% by mass sodium carbonate solution, a 0.1 to 5% by mass potassium carbonate solution, and a 0.1 to 5% by mass sodium hydroxide solution. The pH of the alkaline aqueous solution is preferably in a range of 9 to 11. The temperature of the alkaline aqueous solution is adjusted according to the developability of the photosensitive layer 20. Furthermore, the alkaline aqueous solution may contain a surfactant, an antifoaming agent, an organic solvent, and the like. Examples of the development method include a dip method, a spray method, brushing, and slapping.

As a treatment after the development step, heating at about 60 to 250° C. or exposure at about 0.2 to 10 J/cm$^2$ may be performed as necessary to further cure the resist pattern.
[Method for Producing Printed Circuit Board]

A method for producing a printed circuit board according to the present embodiment includes a step of subjecting a substrate having a resist pattern formed by the above-described method for forming a resist pattern to an etching treatment or a plating treatment to form a conductor pattern. Herein, the etching or plating of the substrate can be performed by etching or plating the surface of the substrate by a known method using the resist pattern as a mask.

As an etching solution used for etching, for example, a cupric chloride solution, a ferric chloride solution, and an alkali etching solution can be used. Examples of the plating include copper plating, solder plating, nickel plating, and gold plating.

After etching or plating is performed, the resist pattern can be released, for example, with an aqueous solution of stronger alkalinity than the alkaline aqueous solution used for the development. As this strong alkaline aqueous solution, for example, a 1 to 10% by mass sodium hydroxide aqueous solution and a 1 to 10% by mass potassium hydroxide aqueous solution are used. Furthermore, examples of the releasing method include a dip method and a spray method. Note that, a printed circuit board on which the resist pattern has been formed may be a multilayer printed circuit board, and may have small through-holes.

In the case of subjecting a substrate including an insulation layer and a conductor layer formed on the insulation layer to plating, it is necessary to remove an area of the conductor layer other than the resist pattern. Examples of this removing method include a method of releasing the resist pattern and then lightly etching; and a method of performing solder plating or the like after the plating and then releasing the resist pattern to leave a solder mask on the wiring sections, and then performing treatment using an etching solution capable of etching only the conductor layer on the sections where the solder mask is not formed.

Hereinbefore, preferred embodiments of the present disclosure have been described; however, the present invention is not limited to the above-described embodiments by any means.

EXAMPLES

Hereinafter, the present disclosure will be specifically described on the basis of Examples; however, the present invention is not limited thereto.
[Photosensitive Resin Composition]

Respective components were mixed at blending amounts (parts by mass) shown in Table 1 to prepare a photosensitive resin composition. The details of respective components shown in Table 1 are as follows.
(Binder Polymer)

A-1: Ethylene glycol monomethyl ether/toluene solution (solid content: 40% by mass) of copolymer of methacrylic acid/methyl methacrylate/styrene/benzyl methacrylate (mass ratio: 27/5/45/23, Mw: 45000, acid value: 107 mgKOH/g)

(Photopolymerizable Compound)

FA-321M: EO-modified bisphenol A dimethacrylate (manufactured by Showa Denko Materials Co., Ltd., the number of EO groups: 10 (average value))

FA-024M: Polyalkylene glycol dimethacrylate (manufactured by Showa Denko Materials Co., Ltd., the number of EO groups: 12 (average value), the number of PO groups: 4 (average value))

BPE-200: 2,2-Bis(4-(methacryloxydiethoxy)phenyl)propane (manufactured by SHIN-NAKAMURA CHEMICAL Co., Ltd.)

(Photopolymerization Initiator)

B-CIM: 2,2'-Bis(2-chlorophenyl)-4,4',5,5'-tetraphenyl biimidazole (manufactured by Hodogaya Chemical Co., Ltd.)

(Sensitizer)

EAB: 4,4'-Bis(diethylamino)benzophenone (manufactured by Hodogaya Chemical Co., Ltd.)

TABLE 1

| Component | | Blending amount |
|---|---|---|
| Binder polymer | A-1 | 123 |
| Photopolymerizable | FA-321M | 28 |
| compound | FA-024M | 5 |
| | BPE-200 | 10 |
| Photopolymerization initiator | B-CIM | 2.9 |
| Sensitizer | EAB | 0.08 |
| Coloring agent | Leuco crystal violet | 0.3 |
| Dye | Malachite Green | 0.05 |
| Polymerization inhibitor | 4-tert-Butylcatechol | 0.02 |
| Solvent | Methanol | 5 |
| | Acetone | 5 |
| | Toluene | 9 |

A polyethylene terephthalate film (manufactured by Toray Industries, Inc., trade name: FB-40, thickness: 16 μm) was prepared as a support film. A polyethylene film (manufactured by TAMAPOLY CO., LTD., trade name: NF-15, thickness: 19 μm) having a weld line with a width of 66.5 μm and a height of 1.6 μm on the winding inner surface was prepared as a protective film.

[Photosensitive Element]

Example 1

A solution of the photosensitive resin composition was applied uniformly onto the support film using a comma coater. Subsequently, the solution was dried for 2 minutes with a hot air convection drier at 100° C. to form a photosensitive layer having a thickness of 15 μm. Then, the winding outer surface of the protective film was bonded onto the photosensitive layer to produce a photosensitive element.

Comparative Example 1

A photosensitive element was produced in the same manner as in Example 1, except that the winding inner surface of the protective film was bonded onto the photosensitive layer.

(Evaluation)

The photosensitive element was wound around a cylindrical core (width: 560 mm, outer diameter: 84 mm, inner diameter: 76 mm) in a roll shape at a tension of 90 N/m so that the protective film was disposed on the inner side and the support film was disposed on the outer side, thereby producing a photosensitive element roll.

The photosensitive element of Example 1 can prevent air entrapment during winding and can suppress the transferring of the weld line of the protective film to the photosensitive layer.

REFERENCE SIGNS LIST

1: photosensitive element, 10: support film, 10a: one surface, 10b: other surface, 20: photosensitive layer, 20a: one surface, 20b: other surface, 30: protective film, 30a: one surface, 30b: other surface, 32: weld line, 300: photosensitive element roll, 301: core.

The invention claimed is:

1. A photosensitive element comprising:
a support film;
a photosensitive layer provided on one surface of the support film; and
a protective film provided on a surface of the photosensitive layer opposite to the support film, wherein
the protective film has a weld line on a surface opposite to the photosensitive layer, and a width of the weld line is 45 to 300 μm.

2. The photosensitive element according to claim 1, wherein the protective film is a polyethylene film.

3. The photosensitive element according to claim 1, wherein a height of the weld line is 0.10 to 3.0 μm.

4. A method for producing a photosensitive element, the method comprising:
a step of forming a photosensitive layer on a support film using a photosensitive resin composition; and
a step of bonding a winding outer surface of a protective film having a roll shape onto the photosensitive layer, wherein
the protective film has a weld line in a longitudinal direction of a winding inner surface, and a width of the weld line is 45 to 300 μm.

5. The method for producing a photosensitive element according to claim 4, wherein the protective film is a polyethylene film.

6. The method for producing a photosensitive element according to claim 5, wherein a height of the weld line is 0.10 to 3.0 μm.

7. The method for producing a photosensitive element according to claim 4, wherein a height of the weld line is 0.10 to 3.0 μm.

* * * * *